United States Patent
Yang

(10) Patent No.: US 8,847,122 B2
(45) Date of Patent: Sep. 30, 2014

(54) METHOD AND APPARATUS FOR TRANSFERRING SUBSTRATE

(75) Inventor: Chin-Cheng Yang, Hsinchu (TW)

(73) Assignee: MACRONIX International Co., Ltd., Hsinchu (TW)

(*) Notice: Subject to any disclaimer, the term of this patent is extended or adjusted under 35 U.S.C. 154(b) by 149 days.

(21) Appl. No.: 12/480,131

(22) Filed: Jun. 8, 2009

(65) Prior Publication Data

US 2010/0310342 A1 Dec. 9, 2010

(51) Int. Cl.
*H05B 3/68* (2006.01)
*H01L 21/687* (2006.01)
*H01L 21/67* (2006.01)
*H01L 21/677* (2006.01)

(52) U.S. Cl.
CPC .... *H01L 21/68742* (2013.01); *H01L 21/67109* (2013.01); *H01L 21/67748* (2013.01); *Y10S 414/135* (2013.01)
USPC .......................... 219/444.1; 414/806; 414/935

(58) Field of Classification Search
CPC ............... H01L 21/67769; H01L 21/67736; H01L 21/67742; H01L 21/67745; H01L 21/67766; H01L 21/68707; H01L 21/67748; H01L 21/67173; H01L 21/67778
USPC .......... 414/624, 222.01, 222.13, 217, 222.07, 414/222.08, 222.09, 805, 806, 935; 432/4; 219/444.1; 118/58
See application file for complete search history.

(56) References Cited

U.S. PATENT DOCUMENTS

| | | | | |
|---|---|---|---|---|
| 5,553,994 | A | * | 9/1996 | Biche et al. ............. 198/750.12 |
| 5,651,823 | A | * | 7/1997 | Parodi et al. ................ 118/500 |
| 5,935,768 | A | | 8/1999 | Biche et al. |
| 6,519,417 | B2 | | 2/2003 | Lee et al. |
| 6,808,391 | B2 | | 10/2004 | Yun |
| 6,814,507 | B2 | * | 11/2004 | Inagaki ......................... 396/571 |
| 6,846,149 | B2 | * | 1/2005 | Savage et al. ............ 414/416.03 |
| 7,274,005 | B2 | * | 9/2007 | Quach et al. ............... 219/444.1 |
| 7,282,675 | B2 | * | 10/2007 | Quach et al. ............... 219/444.1 |
| 7,288,746 | B2 | * | 10/2007 | Quach et al. ............... 219/444.1 |
| 7,323,060 | B2 | * | 1/2008 | Yamada et al. ............. 118/500 |
| 7,357,842 | B2 | * | 4/2008 | Ishikawa et al. ............. 118/503 |

(Continued)

FOREIGN PATENT DOCUMENTS

TW 200401388 1/2004
TW 200801834 1/2008

OTHER PUBLICATIONS

"Office Action of Taiwan Counterpart Application", issued on Sep. 25, 2012, p. 1-p. 8.

*Primary Examiner* — Saul Rodriguez
*Assistant Examiner* — Glenn Myers
(74) *Attorney, Agent, or Firm* — J.C. Patents

(57) ABSTRACT

A method and an apparatus for transferring a substrate are described. In the method, a substrate is provided on the surface of a first plate at a first position, the first plate is moved from the first position to a second position in an upper space of a second plate, the substrate is lifted away from the surface of the first plate, the first plate is moved away from the second position, and the substrate is put on the surface of the second plate from the upper space. The apparatus includes a first plate and a second plate each having a surface for carrying the substrate, wherein the first plate can be moved between the first position and the second position.

8 Claims, 3 Drawing Sheets

(56) References Cited

U.S. PATENT DOCUMENTS

| | | |
|---|---|---|
| 7,678,417 B2 * | 3/2010 | Hara et al. .................... 427/240 |
| 7,699,021 B2 * | 4/2010 | Volfovski et al. ............. 118/500 |
| 2006/0130747 A1 | 6/2006 | Ishikawa et al. |
| 2006/0130751 A1 * | 6/2006 | Volfovski et al. ............. 118/300 |
| 2006/0216665 A1 | 9/2006 | Fukuoka et al. |
| 2006/0262287 A1 | 11/2006 | Hiar et al. |
| 2007/0254493 A1 * | 11/2007 | Salinas et al. ................ 438/795 |
| 2008/0002681 A1 | 1/2008 | Bajic et al. |

\* cited by examiner

METHOD AND APPARATUS FOR TRANSFERRING SUBSTRATE

BACKGROUND OF THE INVENTION

1. Field of Invention

This invention relates to a method and an apparatus for transferring a substrate, particularly a method and an apparatus for transferring a wafer between hot plates.

2. Description of Related Art

Hot plates are widely used to heat solids or liquids. For a thermal process that includes two or more stages of different temperatures, usually the same number of hot plates are used to achieve continuous processing of multiple substrates. For example, a photoresist reflow process usually includes two heating steps at different temperatures and uses two hot plates for the two heating steps respectively.

FIG. 1 shows the temperature profile for such a photoresist reflow process as a two-step thermal process in the prior art. The process may be performed to a patterned photoresist layer 110 that is formed on a substrate 100 and has therein an opening 120, so as to reduce the size of the opening 120. The reflow process includes a first heating step at a first temperature $T_1$ between the time points $t_1$ and $t_2$ and a second heating step at a second temperature $T_2$ ($>T_1$) between $t_3$ and $t_4$, with a transfer time for transferring the substrate from the first hot plate to the second one between the two heating steps. The resulting opening 120a after the second heating step has a smaller size.

Conventionally, a substrate is moved between hot plates by a robot. However, since the movement by a robot takes a relatively long time of about 8-15 seconds, a significant temperature drop occurs during the transfer time so that the thermal dosage and the resulting opening shrinkage and critical dimension (CD) are difficult to control. In addition, the throughput is lowered due to the slow substrate transfer.

SUMMARY OF THE INVENTION

Accordingly, this invention provides a method for transferring a substrate, which can effectively reduce the transfer time between different plates.

This invention also provides an apparatus for transferring a substrate, which allows the transfer time between different plates to be much reduced.

The method of transferring a substrate of this invention is described below. A substrate is provided on the surface of a first plate at a first position. The first plate is moved from the first position to a second position in an upper space of a second plate. The substrate is lifted away from the surface of the first plate. The first plate is moved away from the second position. The substrate is then put on a surface of the second plate from the upper space.

In an embodiment, the first and the second plates are hot plates for heating the substrate, and the surfaces of the hot plates have different heating temperatures.

In an embodiment, the step of lifting the substrate away from the surface of the first plate and the step of putting the substrate on the surface of the second plate use a set of pins that can be stretched out from the surface of the second plate and retracted. The pins pass a set of gaps in the first plate during the step of lifting the substrate away from the surface of the first plate and during the step of moving the first plate away from the second position.

In an embodiment, the method of transferring a substrate of this invention further includes the following steps. The substrate is lifted away from the surface of the second plate. A third plate is moved into a space between the substrate and the second plate. The substrate is put on the surface of the third plate. The third plate is moved away from the upper space of the second plate and to a third position. It is possible that the first and the second plates are hot plates for heating the substrate, the surfaces of the hot plates have different heating temperatures and the third plate is a cooling plate for cooling the substrate.

In an embodiment where the third plate is also used, the step of lifting the substrate away from the surface of the first plate, the step of putting the substrate on the surface of the second plate, the step of lifting the substrate away from the surface of the second plate and the step of putting the substrate on the surface of the third plate use a set of pins that can be stretched out from the surface of the second plate and retracted. The pins pass a set of gaps in the first plate during the step of lifting the substrate away from the surface of the first plate and during the step of moving the first plate away from the second position, and pass a set of gaps in the third plate during the step of moving the third plate into the space between the substrate and the second plate and during the step of putting the substrate on the surface of the third plate.

In an embodiment, the substrate being transferred is a wafer.

The apparatus for transferring a substrate of this invention includes a first plate and a second plate each having a surface for carrying the substrate. The first plate can be moved between a first position and a second position in an upper space of the second plate. The substrate is loaded on the first plate at the first position, and is unloaded from the first plate at the second position and put on the surface of the second plate.

In an embodiment, the first and the second plates are hot plates for heating the substrate, and the surface of the hot plates have different heating temperatures.

In an embodiment, the second plate is equipped with substrate lifting/lowering means. The substrate lifting/lowering means lifts the substrate away from the surface of the first plate at the second position to unload the substrate from the first plate, and lowers the substrate to put the substrate on the surface of the second plate. In such an embodiment, it is possible that the lifting/lowering means includes a set of pins that can be stretched out and retracted back, the first plate has therein a set of gaps that extend in a moving direction of the first plate and are aligned with the pins in the moving direction of the first plate, and the pins can be stretched out through the gaps when the first plate is at the second position. The first plate may also be equipped with a set of pins that can be stretched out through the gaps in the first plate when the first plate is at the first position and can be retracted back.

In an embodiment, the apparatus further includes a third plate that has a surface for carrying the substrate and can be moved between the second position and a third position, wherein the substrate is loaded onto the surface of the third plate at the second position after unloaded from the second plate. It is possible that the first and second plates are hot plates for heating the substrate, the surface of the hot plates have different heating temperatures and the third plate is a cooling plate for cooling the substrate.

In an embodiment where the third plate is also included, the second plate is equipped with substrate lifting/lowering means. The substrate lifting/lowering means lifts the substrate away from the surface of the first plate to unload the substrate from the first plate, lowers the substrate to put the substrate on the surface of the second plate, lifts the substrate away from the surface of the second plate to unload the substrate from the second plate, and lowers the substrate to put the substrate on the surface of the third plate, after the substrate is lifted away from the surface of the second plate and the third plate is moved to the second position.

In an embodiment where the third plate is included and the $2^{nd}$ plate equipped with substrate lifting/lowering means, the lifting/lowering means includes a set of pins that can be stretched out and retracted back, the first plate has therein a set of gaps that extend in the moving direction of the first plate and are aligned with the pins in the moving direction of the first plate, the third plate has therein a set of gaps that extend in the moving direction of the third plate and are aligned with the pins in the moving direction of the third plate, and the pins can be stretched out through the gaps in the first or third plate when the first or third plate is at the second position. It is possible that the first plate is also equipped with a set of pins that can be stretched out through the gaps in the first plate as the first plate is at the first position and can be retracted, and the third plate is also equipped with a set of pins that can be stretched out through the gaps in the third plate as the third plate is at the third position and can be retracted.

In an embodiment where the third plate is included, the first plate, the second plate and the third plate are arranged sequentially in a single direction. In another embodiment, the first and second plates are arranged in a first direction, and the second and third plates are arranged in a second direction different from the first direction.

In an embodiment, the substrate being transferred is a wafer.

Since directly using a plate to transfer a substrate is much quicker than using a robot, the transfer time is much reduced with the transfer method or apparatus of this invention. Therefore, by applying the method to a thermal process using two or more hot plates, the throughput of the thermal process can be improved.

Moreover, as the transfer method of this invention is applied to a thermal process requiring the substrate to be transferred between two or more hot plates set at different temperatures, the temperature drop during the transfer is much reduced due to the much reduced transfer time, so that the thermal dosage is easier to control. Therefore, when the thermal process is a two-step photoresist reflow process for shrinking an opening pattern, the opening shrinkage and the critical dimension (CD) are easier to control.

In order to make the aforementioned and other objects, features and advantages of this invention comprehensible, a preferred embodiment accompanied with figures is described in detail below.

DESCRIPTION OF EMBODIMENTS

This invention is further explained with the following embodiments, which are not intended to restrict the scope of this invention. For example, though the substrates being transferred in the embodiments are wafers to be heated on hot plates, they may alternatively be substrates of any other type requiring any other type of treatment on any other type of plates in consideration of the transfer mechanism. Moreover, though the substrate lifting/lowering means in each embodiment includes a set of pins, it may alternatively have another mechanism in other embodiments.

In addition, the direction in which the two hot plates are arranged and the direction in which the second hot plate and the cooling plate are arranged may not be the same or be perpendicular to each other. It is also possible that the non-movable hot plate has a height close to the height of the movable hot plate and the movable cooling plate at their original positions and the movable hot plate and the cooling plate are moved not only horizontally but also slightly vertically by a different mechanism to over the second hot plate.

Furthermore, though the thermal process in any of the embodiments uses two hot plates to perform two heating steps respectively, the substrate transfer method of this invention can be readily applied to any thermal process using three or more hot plates to perform three or more heating steps wherein one or more hot plates are movable.

Figure 2:
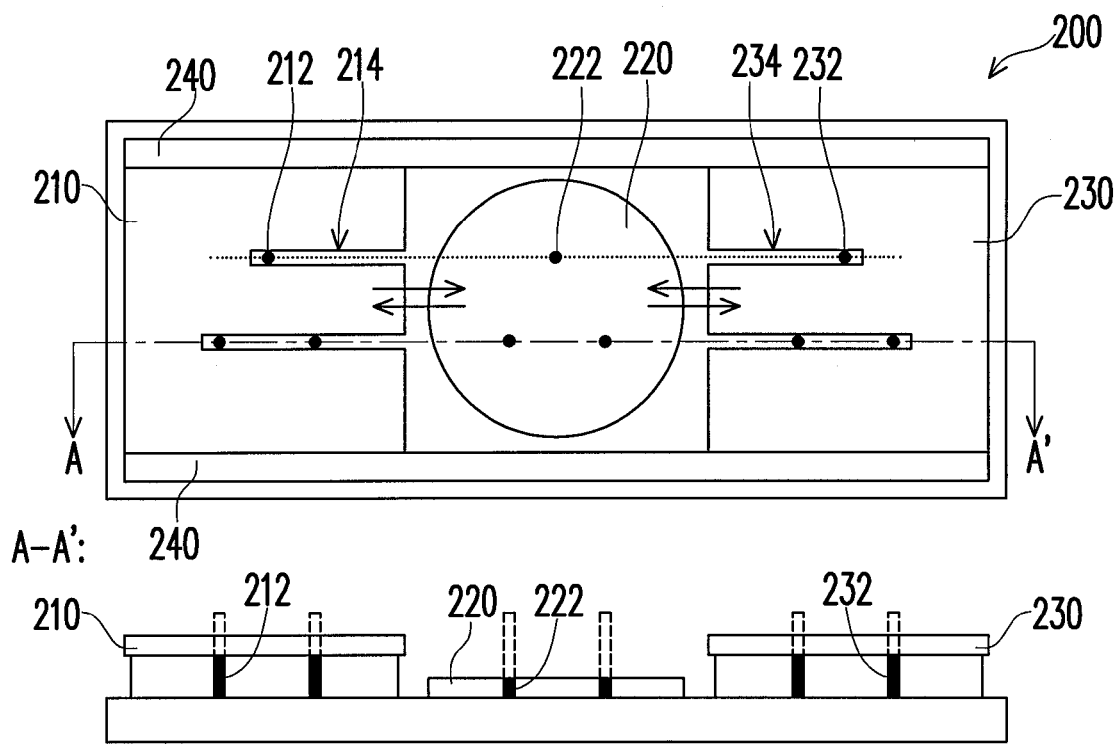
FIG. 2 illustrates, in a top view and in A-A' cross-sectional view, an apparatus for a thermal process using two hot plates according to a first embodiment of this invention.

FIG. 2 illustrates, in a top view and in A-A' cross-sectional view, an apparatus for a thermal process using two hot plates according to a first embodiment of this invention.

Referring to FIG. 2, the apparatus 200 includes a first hot plate 210, a second hot plate 220 and a cooling plate 230 arranged sequentially in a single direction, and two tracks 240. The first hot plate 210 is equipped with three pins 212 that can be stretched out (dash-line profile) and drawn back (solid part), the second hot plate 220 is equipped with three pins 222 that can be stretched out (dash-line profile) and drawn back (solid part), and the cooling plate 230 is equipped with three pins 232 that can be stretched out (dash-line profile) and drawn back (solid part). The first hot plate 210 has therein two gaps 214 through which the three pins 212 can be stretched out, and the cooling plate 230 has therein two gaps 234 through which the three pins 232 can be stretched out.

The first hot plate 210 can be moved along the tracks 240 to over the second hot plate 220 and then moved back. Each of the gaps 214 in the first hot plate 210 extends in the moving direction of the first hot plate 210, and the pins 222 for the second hot plate 220 are aligned with the gaps 214 in the first hot plate 210 in the moving direction. As a result, the pins 222 can be stretched out through the gaps 214 to contact a substrate (not shown) when the first hot plate 210 is over the second hot plate 220, and the gaps 214 allow the pins 222 to pass when the pins 222 are stretched out and the first hot plate 210 is being moved over the second hot plate 220.

The cooling plate 230 can be moved along the tracks 240 to over the second hot plate 220 and then moved back, in a direction the same as the moving direction of the first hot plate 210. Each of the gaps 234 in the cooling plate 230 extends in the moving direction of the cooling plate 230, and the pins 222 for the second hot plate 220 are aligned with the gaps 234 in the cooling late 230 in the moving direction. As a result, the pins 222 can be stretched out through the gaps 234 to contact a substrate (not shown) when the cooling plate 230 is over the second hot plate 220, and the gaps 234 allow the pins 222 to pass when the pins 222 are stretched out and the cooling plate 230 is being moved over the second hot plate 220.

FIGS. 3A-3I illustrate a thermal process using two hot plates according to the first embodiment, wherein the thermal process uses the apparatus 200 shown in FIG. 2.

Figure 3A:
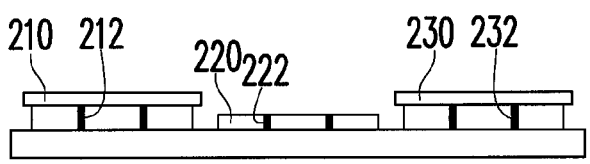
FIGS. 3A-3I illustrate a thermal process using two hot plates according to the first embodiment of this invention.

Referring to FIG. 3A, in the initial state, the movable first hot plate 210 and the movable cooling plate 230 both stay at their original positions, and all the pins 212, 222 and 232 are drawn back.

Figure 1:
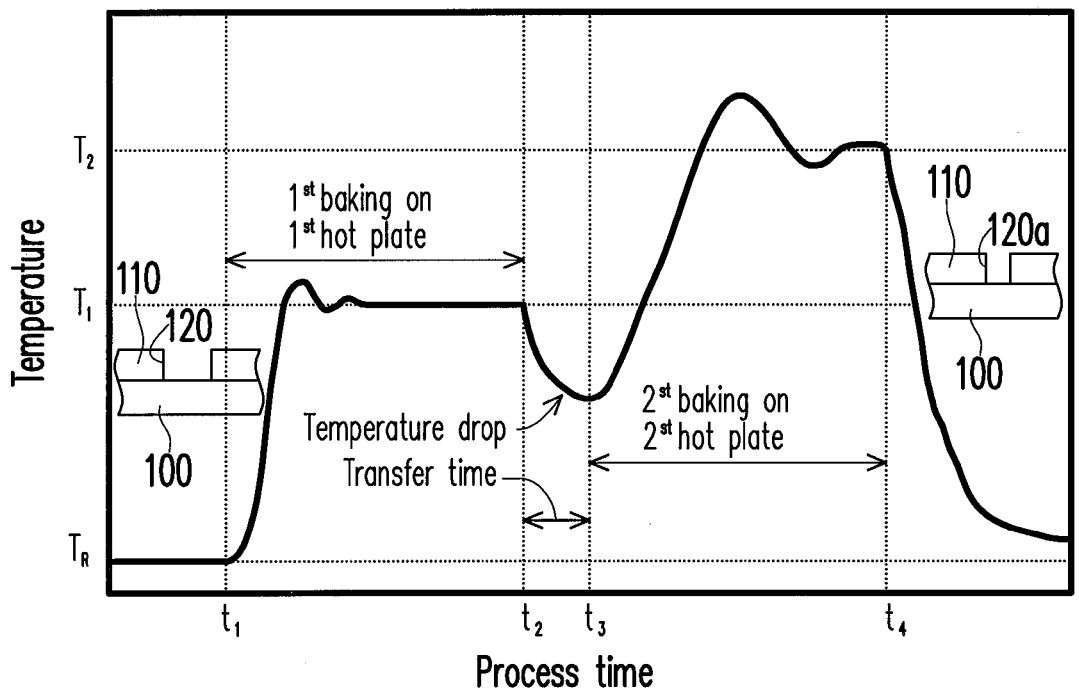
FIG. 1 shows the temperature profile for a two-step photoresist reflow process in the prior art.
Figure 3B:
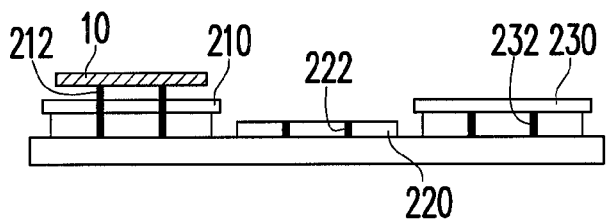

Referring to FIGS. 2 and 3B, the pins 212 for the first hot plate 210 are stretched out through the gaps 214 in the first hot plate 210. A wafer 10, such as one having thereon a patterned photoresist layer to be reflowed, is put on the pins 212 by a carrier, such as a robot. The patterned photoresist layer may have therein openings to be reduced in size, as shown in FIG. 1, wherein the openings may be contact openings.

Figure 3C:
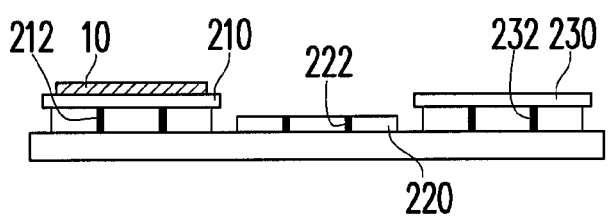

Referring to FIG. 3C, the pins 212 for the first hot plate 210 are drawn back to put the wafer 10 on the first hot plate 210, whereon a first heating step is performed to the wafer 10 at a first temperature for a first period of time.

Figure 3D:
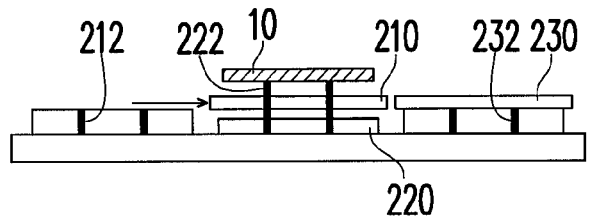

Referring to FIGS. 2 and 3D, after the first heating step is finished, the first hot plate 210 with the wafer 10 thereon is moved to over the second hot plate 220, and the pins 222 for the second hot plate 220 are stretched out through the gaps 214 in the first hot plate 210 to lift the wafer 10 away from the first hot plate 210.

Figure 3E:
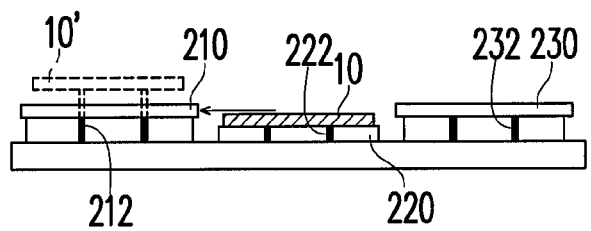

Referring to FIGS. 2 and 3E, the first hot plate 210 is moved back to its original position, wherein the pins 222 for the second hot plate 220 pass the gaps 214 in the first hot plate 210. The pins 222 are then drawn down to put the wafer 10 on the second hot plate 220, whereon a second heating step is performed to the wafer 10 at a second temperature for a second period of time. In addition, after the first hot plate 210 is moved back to its original position, another wafer 10' may be transferred to the first hot plate 210 so that the first heating step of the wafer 10' can be performed together with the second heating step of the wafer 10. By doing so, continuous processing of multiple substrates can be achieved.

The time required for transferring the wafer 10 to the second hot plate 220 as shown in FIGS. 3D and 3E is merely about 0.5-1 second, which is much less than that (~8-15 seconds) with a robot.

Figure 3F:
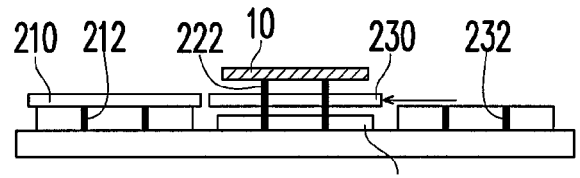

Referring to FIGS. 2 and 3F, after the second heating step is finished, the pins 222 for the second hot plate 220 are stretched out to lift the wafer 10 away from the second hot plate 220. The cooling plate 230 is moved to between the second hot plate 220 and the wafer 10, wherein the pins 222 for the second hot plate 220 pass the gaps 234 in the cooling plate 230. The temperature of the cooling plate is usually set within a small range.

Figure 3G:
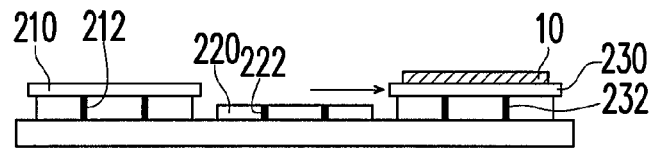

Referring to FIG. 3G, the pins 222 are drawn back to put the wafer 10 on the cooling plate 230, and then the cooling plate 230 is moved back to its original position. A cooling step is then performed to the wafer 10 for a third period of time.

When the wafer 10 has thereon a patterned photoresist layer to be reflowed, for example, the first temperature is usually about 125-135° C., the first period about 45-120 seconds, the second temperature about 145-160° C., the second period about 45-120 seconds, the temperature of the cooling plat 230 about 20-23° C., and the third period about 45-120 seconds.

Figure 3H:
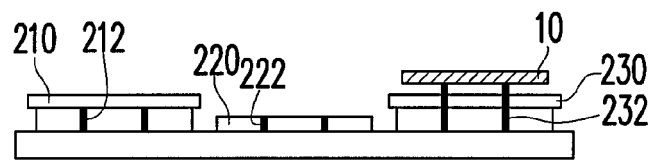

Referring to FIGS. 2 and 3H, after the cooling step is finished, the pins 232 of the cooling plate 230 are stretched out through the gaps 234 in the cooling plate 230 to lift the wafer 10 away from the cooling plate 230.

Figure 3I:
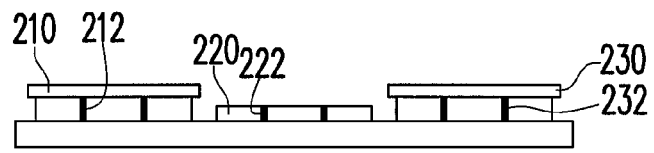

Referring to FIG. 3I, the wafer 10 lifted away from the cooling plate 230 is transfer to another place (not shown), possibly by a robot, and the pins 232 are drawn back so that the apparatus goes back to the initial state shown in FIG. 3A.

Figure 4:
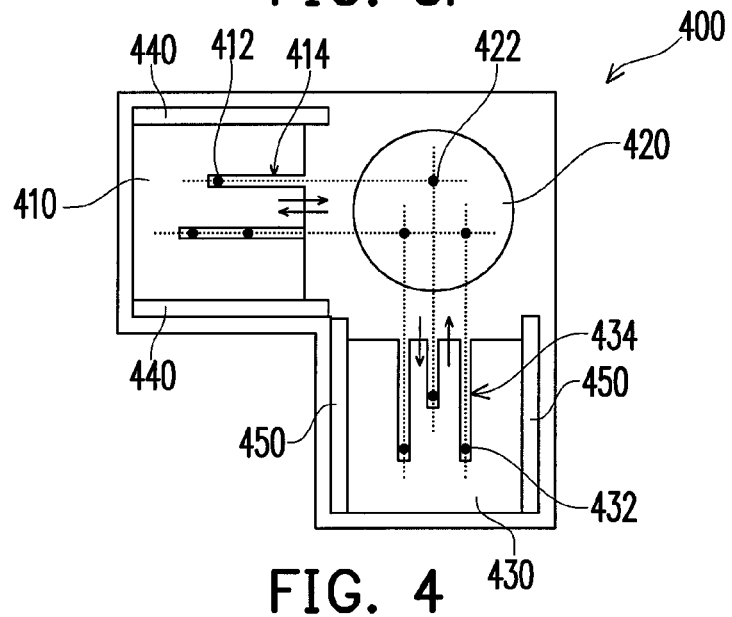
FIG. 4 illustrates, in a top view, an apparatus for a thermal process using two hot plates according to a second embodiment of this invention.

Though the first hot plate, the second hot plate and the cooling plate are arranged sequentially in a single direction in the above first embodiment, the direction in which the first hot plate and the second hot plate are arranged may alternatively be different from the direction in which the second hot plate and the cooling plate are arranged. FIG. 4 illustrates, in a top view, such an apparatus 400 for a thermal process using two hot plates according to a second embodiment of this invention, wherein the direction in which the first hot plate 410 and the second hot plate 420 are arranged is perpendicular to the direction in which the hot plate 420 and the cooling plate 430 are arranged.

Referring to FIG. 4, the first hot plate 410 is equipped with three pins 412, the second hot plate 420 equipped with three pins 422 and the cooling plate 430 equipped with three pins 432, wherein the pins 412, 422 and 432 can be stretched out and drawn back as described above. The first hot plate 410 has therein two gaps 414 through which the three pins 412 can be stretched out. The cooling plate 430 has therein three gaps 434 through which the three pins 432 can be stretched out.

The first hot plate 410 can be moved along the tracks 440 to over the second hot plate 420 and then moved back. Each of the two gaps 414 in the first hot plate 410 extends in the moving direction of the first hot plate 410, and the pins 422 for the second hot plate 420 are aligned with the gaps 414 in the first hot plate 410 in the moving direction. As a result, the pins 422 can be stretched out through the gaps 414 to contact a substrate (not shown) when the first hot plate 410 is over the second hot plate 420, and the gaps 414 allow the pins 422 to pass when the pins 422 are stretched out and the first hot plate 410 is being moved over the second hot plate 420.

The cooling plate 430 can be moved along the tracks 450 to over the second hot plate 420 and then moved back, in a direction perpendicular to the moving direction of the first hot plate 410. Each of the three gaps 434 in the cooling plate 430 extends in the moving direction of the cooling plate 430, and the pins 422 of the second hot plate 420 are aligned with the gaps 434 in the cooling late 430 in the moving direction. As a result, the pins 422 can be stretched out through the gaps 434 to contact a substrate (not shown) when the cooling plate 430 is over the second hot plate 420, and the gaps 434 allow the pins 422 to pass when the pins 422 are stretched out and the cooling plate 430 is being moved over the second hot plate 420.

Moreover, though the substrate is heated firstly on the movable hot plate, the substrate may alternatively be heated firstly on the non-movable hot plate. FIGS. 5A-5E illustrate such a thermal process using two hot plates according to the third embodiment of this invention, wherein the apparatus used includes a movable first hot plate 510 and a second hot plate 520. The first/second hot plate 510/520 is equipped with pins 512/522 that are mechanically similar to the pins 212/222 described in the first embodiment. A movable cooling plate may be further disposed next to and higher than the first hot plate 510, so as to catch a substrate from the latter and cool the same. Alternatively, a non-movable cooling plate may be disposed next to and lower than the first hot plate 510, so that the first hot plate can transfer a substrate to the cooling plate for cooling the substrate.

Figure 5A:
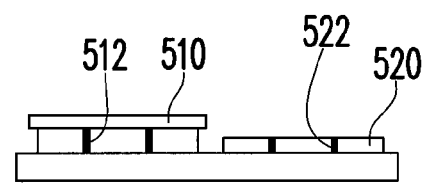
FIGS. 5A-5E illustrate a thermal process using two hot plates according to a third embodiment of this invention.

Referring to FIG. 5A, in the initial state, the movable first hot plate 510 stays at its original position, and all the pins 512 and 522 are drawn back.

Figure 5B:
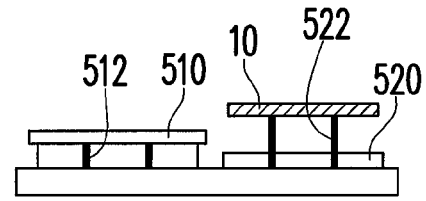

Referring to FIG. 5B, the pins 522 for the second hot plate 520 are stretched out, and a substrate 10 is put on the pins 522 by a carrier, such as a robot.

Figure 5C:
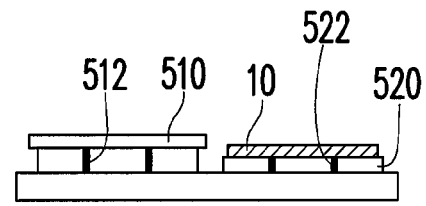

Referring to FIG. 5C, the pins 522 of the second hot plate 520 are drawn back to put the wafer 10 on the second hot plate 520, whereon a first heating step is done.

Figure 5D:
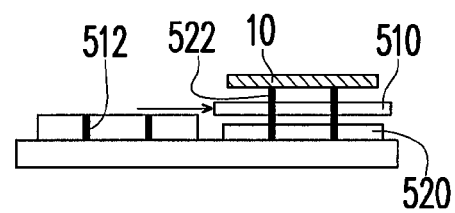

Referring to FIG. 5D, after the first heating step, the pins 522 are stretched out to lift the wafer 10 away from the second hot plate 520. The first hot plate 510 is moved to between the second hot plate 520 and the wafer 10, wherein the pins 522 pass the gaps (not shown) in the first hot plate 510, just like the pins 222 pass the gaps 234 in the cooling plate 230 as described in the first embodiment.

Figure 5E:
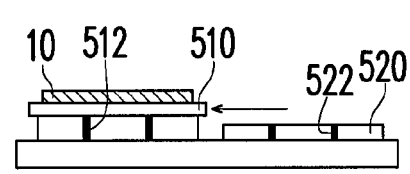

Referring to FIGS. 5D and 5E, the pins 522 are drawn back to put the wafer 10 on the first hot plate 510, and then the first hot plate 510 with the wafer 10 thereon is moved back to its original position to perform a second heating step.

Since directly using a hot plate to transfer a substrate is much quicker than using a robot, the transfer time is much reduced with the transfer method of this invention so that the throughput of the thermal process is improved. For example, in a thermal process which includes only two heating steps each taking 60 seconds and uses two hot plates to process multiple wafers in a continuous manner as shown in FIG. 3E (10 and 10'), the average process time per substrate with a robot is about 68-75 seconds and that with a movable hot plate is about 60.5-61 seconds while the transfer time with a movable hot plate/robot is about 0.5-1/8-15 sec. Thus, the throughput of the thermal process is increased by about 11-24% ((1/60.5-1/75)/(1/75)≈24%, (1/61-1/68)/(1/68) ≈11%) by using a movable hot plate.

Moreover, as the transfer method of this invention is applied to a thermal process requiring a substrate to be transferred between two or more hot plates set at different temperatures, the temperature drop during the transfer is much reduced due to the much reduced transfer time, so that the thermal dosage is easier to control. Therefore, when the thermal process is a two-step photoresist reflow process for shrinking an opening pattern, the opening shrinkage and the critical dimension (CD) are easier to control.

This invention has been disclosed above in the preferred embodiments, but is not limited to those. It is known to persons skilled in the art that some modifications and innovations may be made without departing from the spirit and scope of this invention. Hence, the scope of this invention should be defined by the following claims.

What is claimed is:

1. A method for transferring a substrate, comprising:
providing the substrate on a surface of a first plate, wherein a central position of the first plate is at a first position;
moving the first plate in a single direction such that the central position thereof is moved from the first position to a second position in an upper space of a second plate, wherein the upper space of the second plate is within a border of the second plate in a top view;
lifting the substrate away from the surface of the first plate;
moving the first plate away from the second position;
putting the substrate on a surface of the second plate from the upper space; and
moving a third plate one-dimensionally between the upper space of the second plate and a third position to move the substrate away from the upper space of the second plate, comprising:
lifting the substrate away from the surface of the second plate;
moving the third plate into a space between the substrate and the second plate;
putting the substrate on a surface of the third plate; and
moving the third plate away from the upper space of the second plate and to the third position,
wherein
the step of lifting the substrate away from the surface of the first plate, the step of putting the substrate on the surface of the second plate, the step of lifting the substrate away from the surface of the second plate and the step of putting the substrate on the surface of the third plate utilize a set of pins that can be stretched out from the surface of the second plate and retracted back,
the pins pass a first set of gaps in the first plate during the step of lifting the substrate away from the surface of the first plate and during the step of moving the first plate away from the second position, and pass a second set of gaps in the third plate during the step of moving the third plate into the space between the substrate and the second plate and during the step of putting the substrate on the surface of the third plate,
the first and the second plates are hot plates for heating the substrate,
the surfaces of the hot plates have different heating temperatures, and
the third plate is a cooling plate for cooling the substrate.

2. The method of claim 1, wherein the substrate is a wafer.

3. An apparatus for transferring a substrate, comprising:
a first plate having a surface for carrying the substrate;
a second plate having a surface for carrying the substrate; and
a third plate having a surface for carrying the substrate,
wherein the first plate can be moved such that a central position thereof is moved, only between a first position and a second position that is in an upper space of the second plate, the upper space of the second plate is within a border of the second plate in a top view, the third plate can be moved one-dimensionally between the upper space of the second plate and a third position to move the substrate away from the upper space of the second plate, the substrate is loaded on the first plate at the first position, the substrate is unloaded from the first plate at the second position and put on the surface of the second plate, and the substrate is loaded onto the surface of the third plate at the second position after being unloaded from the second plate,
wherein the second plate is equipped with substrate lifting/lowering means that lifts the substrate away from the surface of the first plate to unload the substrate from the first plate, lowers the substrate to put the substrate on the surface of the second plate, lifts the substrate away from the surface of the second plate to unload the substrate from the second plate, and lowers the substrate to put the substrate on the surface of the third plate after the substrate is lifted away from the surface of the second plate and the third plate is moved to the second position, and
wherein
the lifting/lowering means comprises a set of pins that can be stretched out and retracted back,
the first plate has therein a first set of gaps that extend in a moving direction of the first plate and are aligned with the pins in the moving direction of the first plate,
the third plate has therein a second set of gaps that extend in a moving direction of the third plate and are aligned with the pins in the moving direction of the third plate,
the pins can be stretched out through the first or second set of gaps in the first or third plate when the first or third plate is at the second position,
the first and the second plates are hot plates for heating the substrate,
the surface of the hot plates have different heating temperatures, and
the third plate is a cooling plate for cooling the substrate.

4. The apparatus of claim 3, wherein the first plate is also equipped with a set of pins that can be stretched out through the gaps in the first plate when the first plate is at the first position and can be retracted back.

5. The apparatus of claim 3, wherein
the first plate is also equipped with a set of pins that can be stretched out through the gaps in the first plate as the first plate is at the first position and can be retracted, and
the third plate is also equipped with a set of pins that can be stretched out through the gaps in the third plate as the third plate is at the third position and can be retracted.

6. The apparatus of claim 3, wherein the first plate, the second plate and the third plate are arranged sequentially in a single direction.

7. The apparatus of claim 3, wherein the first and the second plates are arranged in a first direction, and the second and the third plates are arranged in a second direction different from the first direction.

8. The apparatus of claim 3, wherein the substrate is a wafer.

* * * * *